United States Patent [19]

Reynolds

[11] 3,755,026

[45] Aug. 28, 1973

[54] METHOD OF MAKING A SEMICONDUCTOR DEVICE HAVING TUNNEL OXIDE CONTACTS

[75] Inventor: John H. Reynolds, Adams, Mass.

[73] Assignee: Sprague Electric Company, North Adams, Mass.

[22] Filed: Apr. 1, 1971
(Under Rule 47)

[21] Appl. No.: 130,521

Related U.S. Application Data

[62] Division of Ser. No. 767,173, Oct. 14, 1968, abandoned.

[52] U.S. Cl. .................. 156/17, 204/195 R, 324/71, 156/345, 317/235

[51] Int. Cl. .......................... H01l 7/50, B01k 3/00

[58] Field of Search .......................... 156/17, 345, 2; 204/129.2, 192.25, 195 R; 324/71; 317/235

[56] References Cited

UNITED STATES PATENTS

| | | | |
|---|---|---|---|
| 3,228,862 | 1/1966 | Vulcan | 204/129.2 |
| 3,377,263 | 4/1968 | Springer | 204/129.2 X |

*Primary Examiner*—Jacob H. Steinberg
*Attorney*—Connolly and Hutz

[57] ABSTRACT

Semiconductor devices are provided which utilize space charge layers at the surface of a semiconductor to which contact is made through a sufficiently thin portion of an otherwise highly insulating material. The insulating material is thinned down by etching back to a width such that electrons are able to cross it by tunneling.

4 Claims, 12 Drawing Figures

METHOD OF MAKING A SEMICONDUCTOR DEVICE HAVING TUNNEL OXIDE CONTACTS

This is a division of application Ser. No. 767,173, filed Oct. 14, 1968, now abandoned.

BACKGROUND OF THE INVENTION

This invention relates to semiconductor devices and in particular to integrated semiconductor circuits wherein the circuit components are formed by appropriate metal contacts separated from the semiconductor body by a section of an otherwise insulating film which is sufficiently thin that it becomes conducting by tunneling of electrons through the film.

Present integrated circuit technology relies upon the forming of a suitable arrangement of metal-semiconductor contacts and p-n junctions. The disadvantages of the present technique include cumbersome steps involved in the diffusion process of dopants, the possibility of contamination of the semiconducting surface by impurities and uncontrolled interface states between metal contacts and the semiconducting surface.

An alternative proposed method of forming these circuits without requiring diffusion steps is to form tunnel junctions created by sandwiching a thin insulating film between the semiconductor surface and a conductor on the outside of the film. Depending on the impurity doping of the semiconductor body and on the work function or, more generally, the energy band structure, of the conductor, contacts are produced which are rectifying, injecting or ohmic. Several such contacts can be arranged to form resistors, capacitors, bipolar transistors, MOST transistors or the like. A difficulty with this approach however, has been in the formation of the thin insulating layer. This film must be in the order of 10 to 100 A units so that electrons are able to tunnel through the insulating film between the semiconductor and the conductor. There is, of course, a large body of experience regarding the formation of thicker films; i.e. a procedure for forming a thick film (1000 to 10,000 A) of silicon oxide consists in exposing a silicon surface to an oxidizing gaseous atmosphere at elevated temperatures, annealing the oxide film subsequently in an inert atmosphere at about 1100° –1200°C and cooling the film to room temperature in a controlled ambient. It is not, however, practical to produce a thin tunneling oxide film by these procedures since oxide films too thick for tunneling grow quite rapidly at elevated temperatures. Attempts have been made to grow the film at lower temperatures but several disadvantages became apparent: the layer thickness was difficult to control; impurities were still liable to be present on the surface and a film with a well-ordered uniform structure proved difficult to obtain.

It is therefore one object of this invention to provide a new type of semiconductor integrated circuitry which does not require chemically doped p-n junctions.

It is another object of this invention to provide semiconducting devices and circuits by procedures which do not expose the semiconducting surface to the ambient after an initial coating by an insulating film.

It is a still further object of this invention to describe a method for preparation of a thin insulating film which enables tunneling of electrons through the film and achieves a controlled low density of interface states on the surface of the semiconducting substrate.

SUMMARY OF THE INVENTION

In the broadest sense, the present invention describes a contact consisting of a tunneling film region sandwiched between a conductor and a semiconductor. More particularly, the present invention describes methods of forming a tunneling film with the required characteristics and the interconnection of said contacts to perform circuit functions.

A planar semiconductor surface is covered with a thin layer of an insulating material (hereinafter referred to as the "tunneling film"). Conductors are attached to selected regions of the tunneling film the distance between said conductors maintained relatively large compared to the thickness of the film. The film itself has a resistivity large enough so that it provides isolation for lateral current flow between the electrodes but with sufficient conductivity between the electrode and the opposite region of the semiconducting body. A film of uniform thickness and structure is obtained by growing a thick insulating layer and reducing the entire layer, or, more usually, selected portions of the layer, to the desired thickness. During this reduction process, any surface impurities are removed providing a clean film-conductor interface. A uniformly-operating reduction means insures the uniformity of film thickness and allows close control to be maintained over interface states between the conductors and the semiconductor surface.

Another feature of the invention is the contouring of the insulating layer to form regions covered with thicker insulating layers than the tunneling layer. The thicker layers can be utilized in circuit elements such as capacitors or as gate insulators in MOST-type transistors.

DESCRIPTION OF THE INVENTION

In the preferred embodiment of the invention, a tunneling film of silicon oxide 10 to 100 A thick is formed on the surface of a silicon body. Procedures for forming this film on selected areas of the silicon body will be considered first followed by methods for making ohmic, rectifying and injecting contacts. Finally, combinations of contacts to form circuit elements and integrated circuits will be discussed.

Figure 1:
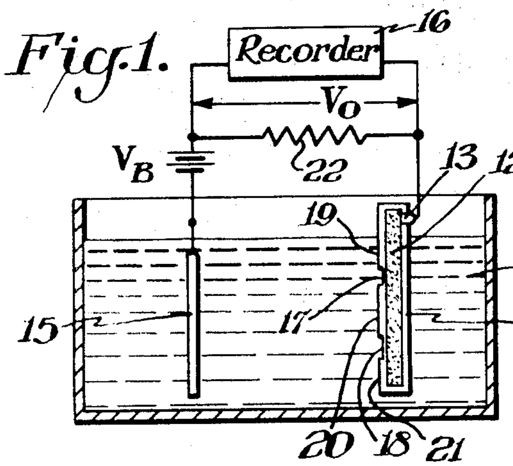
FIG. 1 illustrates the apparatus used to obtain tunneling films adjacent to selected portions of the surface of a silicon body.

FIG. 1 illustrates an apparatus used to reduce a thick oxide layer 11 grown on silicon substrate 12. An electrical contact 13 is made to substrate 12 which is partially or completely immersed in electrolyte cell 14 which contains an etchant capable of removing the oxide. Counterelectrode 15, an inert conductor, is also immersed in the electrolyte. Electrical connections are made to recorder 16 as shown.

It is noted that the oxide is contoured to provide thinner regions 17 and 18 on selected areas of the silicon surface, surrounded by thicker oxide layers 19, 20 and 21. Upon uniform reduction of the oxide, these thicker areas remain non-conducting at all times, while the thinner regions become eventually conductive by tunneling. The decrease of the oxide thickness can be monitored by observing changes in the electrical output to the tunneling range (at recorder 16). When the insulating layer over the tunneling areas approaches the desired thickness a reduction in the internal resistance of the electrolytic cell by many orders of magnitude is observable on the recorder 16 as a rapid rise in cell voltage $V_0$ measured across load resistor 22. When the thickness reaches the desired value, as indicated by a determined reading, or precalibrated curve, on the recorder, etching is stopped and the structure is removed from the cell. The etching action can be stopped abruptly by quenching with large quantities of distilled water.

In a specific example, counterelectrode 15 consists of a platinum sheet which should face the contoured side of the sample and the electrolyte consists of commercial hydrofluoric acid diluted 50:1 by volume in distilled water. Any other electrolyte providing a slow and uniform etch without contaminating the sample could be used. Contact 13 is made to substrate 12 through an opening etched in the oxide layer 11. Load resistor 22 had a resistance of 1 MΩ. An adjustable bucking voltage $V_B$ was set at about one-half the open circuit voltage. This setting has no critical effect on the results but provided greater stability to the voltage measurements. As the sample is immersed, the voltage monitored by the recorder ($V_0$) is observed to be approximately constant and relatively small (since the internal resistance of the cell is much larger than the value of resistor 22). This condition is normally maintained until tunneling through the oxide becomes possible (at about 100 A). At this point the internal resistance of the cell drops abruptly until it is much less than the value of the resistor 22 causing a rapid rise in $V_0$ observable at the recorder. The sample can be removed at this point, or, if a thinner layer is required, another reference point on the recorder may be determined and calibrated.

Other means by which the film thickness can be monitored include optical observations such as reflection, transmission or ellipsometric measurements or observation of electrical properties of the silicon surface such as surface capacitance or surface conductance.

It is noted in FIG. 1 that the oxide layer extends around all surfaces of the silicon. This serves to insulate the silicon. If the contact 13 is to be immersed, it too should be insulated. This insulation is required to ensure that all or most of the circuit flowing through the contact also passes through the area to contain the tunneling film (areas 17 and 18).

There are several means for limiting the tunneling film to selected areas of the silicon body: One method is to cover the entire surface of the substrate with an oxide layer of uniform thickness. Then the areas which are not to be converted into tunneling films are covered with a protective layer which will prevent the removal of material beneath. The structure can then be placed in the cell where the excess material is removed from the unprotected tunneling areas. Upon withdrawal, the protective layers are removed. An alternate method allows the removal of the protective layer prior to the formation of the tunneling film. This is accomplished by contouring the oxide layer so that the oxide covering the tunneling areas is made thinner than that overlying the remainder of the silicon body. This can be done by applying protective layers over the non-tunneling areas and partially etching the oxide in the unprotected areas; by completely removing the oxide from the tunneling areas and reforming a thinner layer (than the surrounding non-conductive areas) by conventional means, or by a combination of these methods. After achieving a pre-established differential between tunneling and non-tunneling areas, the structure can be placed into the cell where the etchant will attack the entire oxide layer at the same rate. A tunneling film is formed in the areas containing the thinnest layer while the remaining thicker layers remain non-conducting.

Figure 2:
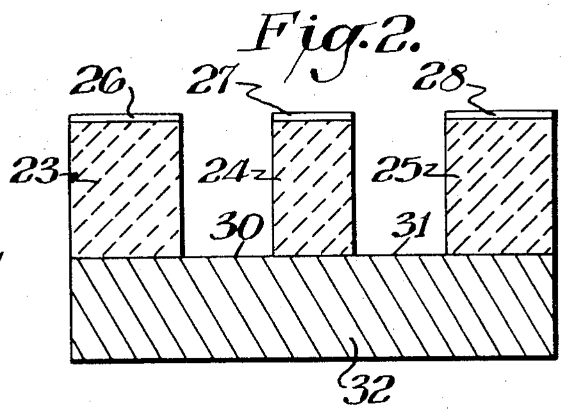
FIG. 2 shows an initial step in a tunneling film contouring process wherein selected portions of an oxide layer have been removed exposing the underlying silicon surface.
Figure 3:
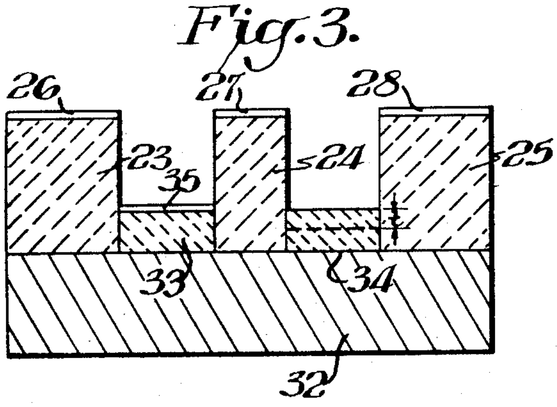
FIG. 3 shows an intermediate step of the contouring process showing formation of thin oxide layers in the exposed areas.
Figure 4:
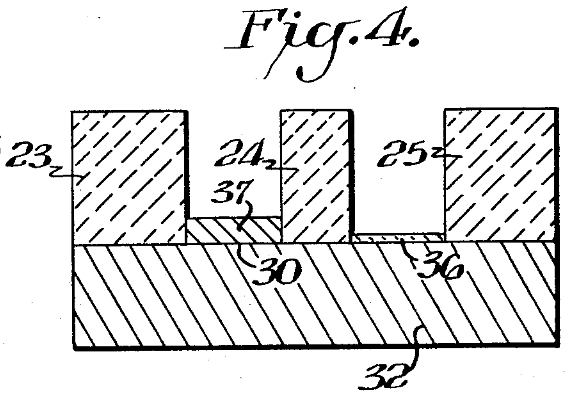
FIG. 4 shows the final step in the contouring process following uniform reduction of the contoured oxide surface.

The contouring procedure can also be used to form regions covered with thicker insulating layers having well controlled thicknesses. An example of this is illustrated in FIG. 2. First, areas 23, 24 and 25 are covered by protective layers 26, 27 and 28 respectively. Then selected areas 30 and 31 of the silicon body 32 are exposed as illustrated. Then, second (thinner) oxide layers 33 and 34 are formed in areas 30 and 31 as shown in FIG. 3. Layer 33 is covered with a protective layer 35 while layer 34 is left unprotected. By a controlled etching procedure, a predetermined amount of material of thickness t is removed from the unprotected region as shown by the dotted line. The protective material is then removed and a tunneling film 36 is formed as illustrated in FIG. 4 and by the procedure described above. During this step, nearly the same amount of material is removed from the entire overlying oxide layer thus maintaining the pre-established thickness differential. As a result, the residual oxide layer thickness 37 in area 30 can be well controlled. Several layer thicknesses can be obtained by repeated controlled etching steps. The thicker layers can be utilized in circuit elements such as capacitors or as gate insulators in MOST-type transistors.

The thin insulating film protects the silicon surface and also inhibits the formation of uncontrolled surface states during the subsequent processing steps.

By applying a conductor on top of this thin insulating film, the concentration of carriers and in some cases, the dominant carrier type in the region of the silicon body immediately adjacent to the film can be altered. The effect of various conductors depends on their work function or more generally on their band structure and the properties of the conductor-insulator interface. As an illustration of this point, the effect of various metallic conductors is displayed in Table 1.

TABLE 1

| Metal | Work Function (eV) | $\phi_b$ (eV) | Carrier Type |
|---|---|---|---|

| | | | |
|---|---|---|---|
| Platinum | 5.3 | 1.25 | $p^+$ |
| Palladium | 5.0 | 0.95 | $p$ |
| Nickel | 4.74 | 0.69 | $p$ |
| Gold | 4.70 | 0.65 | $p$ |
| Copper | 4.52 | 0.47 | $n$ |
| Silver | 4.31 | 0.26 | $n$ |
| Aluminum | 4.20 | 0.15 | $n$ |
| Antimony | 4.10 | 0.05 | $n$ |
| Magnesium | 3.70 | −0.35 | $n^+$ |

The first column lists several metals. The second column lists their work functions, i.e. the energy necessary for emission of electrons from these metals into vacuum. The values in the third column were obtained by subtracting from those of the second column 4.05 eV which is the energy gained by placing an electron from vacuum into the bottom of the conduction band of silicon. It thus gives the energy of the bottom of the conduction band in the reference to the Fermi level of the metal. For example, Table 1 shows that the Fermi level of platinum lies 1.25 eV below the conduction band. Since the silicon band gap is 1.1 eV, the platinum Fermi level also lies below the valence band. Consequently, there exists a large hole concentration in the valence band which is indicated by the symbol $p^+$ in the fourth column. Conversely, in the case of magnesium, the bottom of the conduction band lies below the Fermi level in the metal providing a large electron concentration indicated by $n^+$. For other metals in the table, intermediate carrier concentrations can be indicated.

The surface potential of the semiconductor is not exactly the value indicated in the third column of Table 1 because of the potential drop across the oxide. However, in view of the small thickness of tunneling oxides, about 20–100 A, and for tunnel oxides reasonably free of interface states, this voltage drop represents only a small correction.

Depending on the choice of conductor, a contact to a particular semiconductor can be made ohmic, rectifying or injecting. The principle involved is illustrated in Table 2, where type of carrier and its concentration at the surface is listed with reference to bulk carrier type and concentration.

TABLE 2

| Contact Type | Surface concentration of carriers of same type as in bulk | Surface concentration of opposite carrier type |
|---|---|---|
| Ohmic | larger | much smaller |
| Rectifying (non-injecting) | smaller | smaller |
| Rectifying (injecting) | much smaller | larger |

As an example, consider an n-type semiconductor of 10 ohm-cm resistivity. In order to obtain an ohmic contact, we select a metal from the lower part of Table 1, e.g., Al. In order to obtain a rectifying non-injecting contact, we select a metal from the middle of Table 1, e.g., Au. In order to obtain an injecting contact, we select a metal from the top of Table 1, e.g., Pt.

For a p-type semiconducting body, an ohmic contact would be obtained with platinum and an injecting contact with magnesium.

A utilization of the above described contacts for various circuit functions is described below. The circuit functions will be illustrated by means of the well-known component concept of resistors, capacitors, diodes, and bipolar and unipolar transistors. The examples quoted are merely illustrative and other combinations of tunnel contact arrangements are possible within the scope of the present invention.

A voltage insensitive or constant resistor can be made from the semiconducting body between two ohmic contacts. A voltage sensitive resistor or varactor can be made by combining an ohmic contact and a rectifying contact. The same combination may serve as a diode or rectifier. A capacitor can be made by a metallized contact to an oxide region, which is so thick that tunneling does not occur and using an ohmic tunnel contact to the semiconducting substrate.

Figure 5:
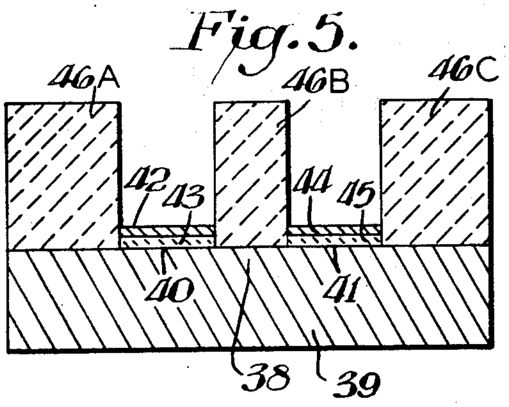
FIG. 5 illustrates a bipolar device constructed in accordance with the present invention.

An example of a bipolar device which does not require diffused junctions is illustrated in FIG. 5. The geometrical arrangement is similar to that of the lateral transistor. The base region 38 consists of a portion of silicon body 39. The emitter and collector contacts 40 and 41 are formed at the surface of the silicon body adjacent to and separated by the base region. The emitter (conductor 42 and tunneling film 43) should provide an injecting tunnel contact. The collector (conductor 44 and tunneling film 45) can provide either an injecting or a rectifying contact. The base contact is an ohmic contact (not shown) to the silicon body. Layers 46A, 46B and 46C are thicker oxide layers.

Figure 6:
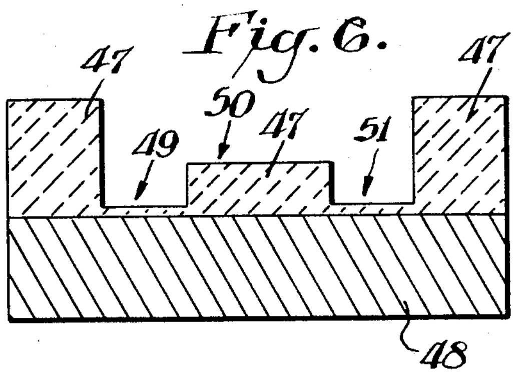
FIGS. 6 and 7 illustrate an MOST device constructed in accordance with the present invention.
Figure 7:
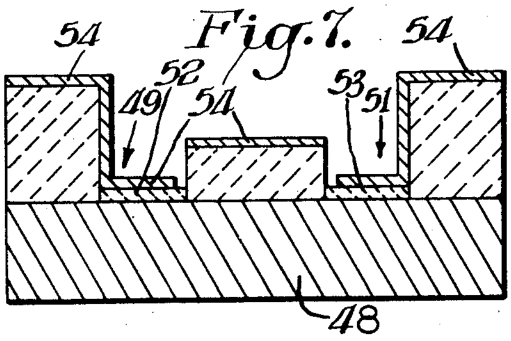

An example for a MOST device is illustrated in FIGS. 6 and 7. First the oxide layer 47, formed on silicon body 48 can be contoured as previously described into the pattern providing source area 49, gate area 50 and drain area 51 illustrated in FIG. 6. Then tunneling films 52 and 53 (FIG. 7) are formed in the source and drain areas 49 and 51. Next, the entire surface of the insulator is covered with conductor layer 54. The conductor should be chosen such that an injecting contact is formed in source area 49 and an injecting or else a rectifying non-injecting, contact is formed in drain area 51.

In the case of an enhancement type MOST, the geometry must be made such that a current path can be established between the induced charge under the gate and the charge beneath the contacts. In particular, this requires a small separation between the gate and the other electrodes. Such a path exists naturally in a depletion type MOST so in this case such a requirement is unnecessary. But, in any case, it is desirable that the geometry be well controlled.

While the components just described have been made exclusively with tunnel contacts, it is possible and may even be advisable in certain cases to substitute conventional contacts or junctions such as metallization directly to the semiconducting body or else using a p-n junction as the collector contact of a bipolar transistor or as the drain contact of a MOST-device.

Figure 8:
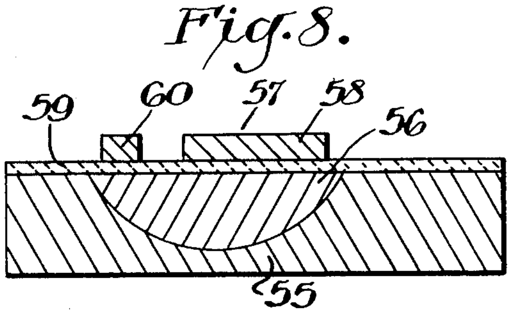
FIG. 8 is a bipolar transistor partially constructed in accordance with the present invention.

As an example of such a hybric structure, let us consider the bipolar transistor of FIG. 8. The silicon body 55 acts as a collector. A base region of opposite conductivity type 56 is formed by chemical doping in a portion of the silicon body. An injecting tunnel contact 57 comprising conductor 58 and tunneling film 59 of the type described above is made to the base region. This forms the emitter. An ohmic tunnel contact 60 to the base region is the base contact of the device.

Tunnel contact devices such as illustrated above, can, by a series of compatible processing steps, be combined on the same semiconductor body to form an integrated circuit. To illustrate this concept, one particular integrated circuit will be described which could serve as part of an A.M. radio receiver.

Figure 9:
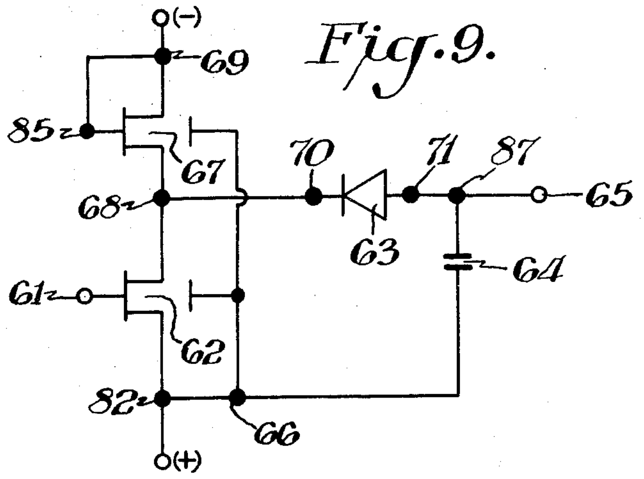
FIG. 9 is a circuit diagram of the integrated circuit shown in FIG. 12.
Figure 10:
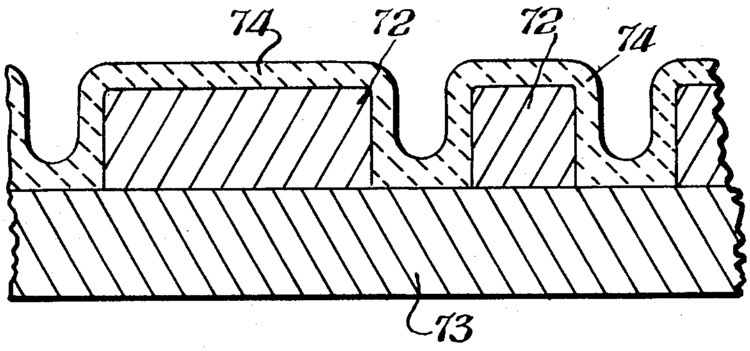
FIGS. 10, 11 and 12 illustrate an integrated circuit formed in accordance with the present invention.
Figure 11:
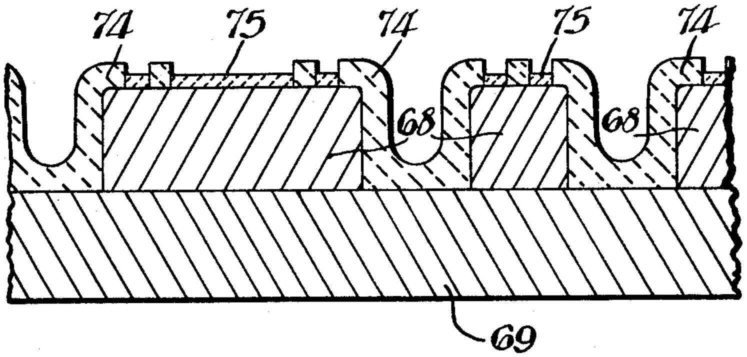
Figure 12:
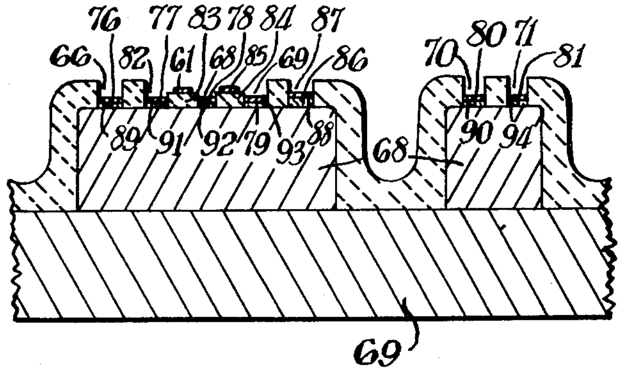

The circuit diagram is shown in FIG. 9. The signal is introduced at point 61, amplified by the MOST 62 at that point, rectified by diode 63, and filtered by capacitor 64. The output terminal is at point 65 and should be connected through an external load to the substrate at point 66. The channel of the MOST 67 between points 68 and 69 acts as a series resistor. The preparation of the integrated circuit by means of the tunnel contact method is illustrated in FIGS. 10–12. For sake of clarity, certain well known subsidiary details, such as the dimensions and the interconnection pattern, will be omitted from the discussion.

As FIG. 9 shows, the diode 63 (between points 70 and 71) must be isolated. The isolation method illustrated in FIGS. 10–12 was chosen because no diffusion is required. Other well known methods may be substituted. An n-type epitaxial layer 72 is formed on p-type silicon 73. The mesa-like structures are formed by removing the n-type silicon around the areas to be isolated. The surface is then covered with an insulating layer 74. FIG. 10 shows two isolated regions. It can be noted that a thin (~1 $\mu$) epitaxial layer is compatible with this technology. A thin layer would make it easier to pass interconnections over the depression between isolated areas.

The circuit elements can be formed as follows: as shown in FIG. 11, the insulator 74 is removed from selected areas and an oxide layer 75 is formed on the exposed areas. Then the oxide is contoured and a tunneling film is formed over the contact areas. Finally, conductors are deposited. The resulting structure is illustrated in FIG. 12. The numbers correspond to the numbered points on the circuit diagram (FIG. 9). Tunneling films 76–81 are formed at points 66, 82, 68, 69, 70 and 71. The oxide layers 83 and 84 at points 61 and 85 form the gate insulators of the two MOST's. The oxide layer 86 at point 87, having ohmic contact 88 forms the dielectric layer of capacitor 64. The conductors 89 and 90 at points 66 and 70 are chosen to form ohmic contacts. For the n-type silicon shown here, a metal, such as aluminum, near the bottom of Table 1 would be suitable. Injecting contacts 91, 92 and 93 should be formed at points 82, 68 and 69. A metal, such as platinum near the top of Table 1, could be used for such a contact. A rectifying contact 94 (or possibly an injecting contact) could be used for the diode at point 71.

Since it is obvious that many changes and modifications can be made in the above-described details without departing from the nature and spirit of the invention it is to be understood that the invention is not limited to said details except as set forth in the appended claims.

What is claimed is:

1. A method for preparing areas of tunneling oxide film on a silicon body comprising the steps of:

a. forming a thick oxide layer around said silicon body, one side contoured to define said tunneling areas;

b. immersing said body into an electrolytic cell containing a solvent providing a uniform chemical etchant for said oxide;

c. immersing an inert conductor into said cell to establish an electric contact to said solvent;

d. connecting monitoring means to said immersed body, said means being capable of monitoring the current flow in said cell and being calibrated such that said current in said cell corresponds to the thickness of said oxide in said tunneling areas; and e. interrupting said chemical etching action when said monitoring means indicates the oxide layer in said tunneling areas has reached the desired thickness for formation of a tunneling film, said interrupting being accomplished by removing said body from said cell and quenching with water.

2. The method of claim 1 wherein said inert conductor is platinum, said electrolyte is hydrofluoric acid diluted 50:1 with distilled water and said monitoring means is a voltage recording device connected across a load resistance.

3. The method of claim 2 wherein a variable voltage supply is connected between said recorder and platinum electrode.

4. The method of claim 1 wherein said contoured side of said oxide is provided by applying a protective layer over said oxide, exposing selected tunneling areas in said oxide, and partially etching away said oxide in said selected tunneling areas.

* * * * *